United States Patent
Bakran et al.

(10) Patent No.: US 7,582,939 B2
(45) Date of Patent: Sep. 1, 2009

(54) SEMICONDUCTOR DIODE, ELECTRONIC COMPONENT AND VOLTAGE SOURCE INVERTER

(75) Inventors: Mark-Matthias Bakran, Erlangen (DE); Hans-Günter Eckel, Erlangen (DE)

(73) Assignee: Siemens Aktiengesellschaft, München (DE)

( * ) Notice: Subject to any disclaimer, the term of this patent is extended or adjusted under 35 U.S.C. 154(b) by 341 days.

(21) Appl. No.: 10/547,175

(22) PCT Filed: Feb. 18, 2004

(86) PCT No.: PCT/EP2004/001541

§ 371 (c)(1),
(2), (4) Date: Aug. 25, 2005

(87) PCT Pub. No.: WO2004/077573

PCT Pub. Date: Sep. 10, 2004

(65) Prior Publication Data

US 2006/0071280 A1    Apr. 6, 2006

(30) Foreign Application Priority Data

Feb. 26, 2003  (DE) ................. 103 08 313

(51) Int. Cl.
*H01L 29/76* (2006.01)
*H01L 29/94* (2006.01)
*H01L 31/062* (2006.01)
*H01L 29/74* (2006.01)

(52) U.S. Cl. ............. 257/367; 257/147; 257/153; 257/161; 257/328; 257/329

(58) Field of Classification Search .......... 257/367, 257/328–329, 147, 153, 161
See application file for complete search history.

(56) References Cited

U.S. PATENT DOCUMENTS 5,082,795 A    1/1992   Temple (Continued)

FOREIGN PATENT DOCUMENTS

DE          43 33 618 C2    4/1994

(Continued)

OTHER PUBLICATIONS

Schröder D: "Elektrische Antriebe 3—Leistungselektronische Bauelemente", 1996, pp. 373-377, XP009038852, Springler Verlag, Berlin, Germany.

(Continued)

*Primary Examiner*—Shouxiang Hu
(74) *Attorney, Agent, or Firm*—Henry M. Feiereisen; Ursula B. Day (57) ABSTRACT

The invention relates to a semiconductor diode, an electronic component and to a voltage source converter. According to the invention, the semiconductor diode having at least one pn-transition can be switched between a first state and a second state. In comparison to the first state, the second state has a greater on-state resistance and a smaller accumulated charge, and the pn-transition is capable of blocking both in the first state as well as in the second state with at least one predetermined blocking ability. An MOS-controlled diode is hereby obtained in which the transition from the on-state to the blocking state is simplified and is thus not critical with regard to the temporal sequence of the control pulses.

14 Claims, 4 Drawing Sheets

U.S. PATENT DOCUMENTS

| | | | |
|---|---|---|---|
| 5,633,515 A * | 5/1997 | Gantioler et al. | 257/140 |
| 6,278,314 B1 | 8/2001 | Asplund et al. | |
| 6,537,921 B2 * | 3/2003 | Metzler | 438/719 |
| 6,870,132 B2 * | 3/2005 | Stava | 219/130.51 |
| 2001/0004322 A1 * | 6/2001 | Kurokami et al. | 363/56.03 |
| 2002/0121678 A1 * | 9/2002 | Huang | 257/656 |
| 2003/0169611 A1 * | 9/2003 | Nishizawa et al. | 363/132 |

FOREIGN PATENT DOCUMENTS

| | | |
|---|---|---|
| WO | WO 01/67587 | 9/2001 |

OTHER PUBLICATIONS

Bakran M M et al.: "Evolution of IGBT Converters for Mass Transit Applications", Conference Record of the 2000 IEEE Industry Applications Conference, 35$^{th}$ IAS Annual Meeting and World Conference on Industrial Applications of Electrical Energy, Rome, Italy, vol. 3, Oct. 8, 2000, pp. 1930-1935, XP001043307, IEEE, New York, NY, USA.

Y. Shakwek & E. A. Lewis: "The Universal Medium Voltage Adjustable Speed Drive", EPE '99 Lausanne, 1999, pp. 1-8.

Xiaoming Yuan & Ivo Barbi: "Fundamentals of a New Diode Clamping Multilevel Inverter", IEEE Transactions on Power Electronics, vol. 15, No. 4, Jul. 2000, pp. 711-718.

José Rodríguez, Jih-Sheng Lai & Fang Zheng Peng: "Multilevel Inverters: A Survey of Topologies, Controls, and Applications", IEEE Transactions on Industrial Electronics, vol. 49, No. 4, Aug. 2002, pp. 724-738.

* cited by examiner

SEMICONDUCTOR DIODE, ELECTRONIC COMPONENT AND VOLTAGE SOURCE INVERTER

BACKGROUND OF THE INVENTION

The invention relates to a semiconductor diode, an electronic component and a voltage source converter. The invention furthermore relates to a control method for a voltage source converter.

With the aid of converters, an alternating-current system having a specific voltage, frequency and number of phases is converted into an alternating-current system having a different voltage, frequency and, if appropriate, number of phases. Voltage source converters use a double conversion method for the conversion. The input alternating current is firstly rectified. The DC voltage is smoothed in the intermediate circuit and converted into an alternating current having a different voltage and frequency in the inverter. Converters can furthermore be used for the conversion of systems in which a voltage regularly varies with respect to time without a voltage zero crossing occurring.

In voltage source converters appertaining to power electronics, components used include active semiconductor switches (turn-off power semiconductors, e.g. MOSFET (Metal Oxide Semiconductor Field Effect Transistor), IGBT (Isolated Gate Bipolar Transistor), bipolar transistors, GTO (Gate Turn-Off Thyristor), IGCT (Integrated Gate Commutated Thyristor)) and freewheeling diodes. Freewheeling diodes are diodes which can in electronic circuits appertaining to power electronics, during operations for turning off or switching over the electrical energy or charge stored in inductances, offer a current path for outputting energy or charge.

The switch-on speed of the turn-off power semiconductors is limited in voltage source converters by the time required by the freewheeling diode for it to be able to take up voltage. This in turn is limited by state delays on account of finite charge carrier speeds. This occurs particularly when current and voltage change very rapidly. The state delay results in particular from the fact that the diode, in the current-carrying phase, is flooded with charge carriers which, in the event of a phase change, that is to say switchover to the reverse direction, and the associated commutation, that is to say change in the current direction, firstly have to be depleted from the diode before the diode can take up voltage. The charge carriers that are still to be depleted during the switchover of the diode are also referred to as the storage charge and the associated behavior of the diode is referred to as the reverse recovery behavior.

Consequently, in voltage source converters, the reverse recovery behavior of the freewheeling diodes, in particular the time required for depleting the storage charge, limits the permissible switch-on speed of the active semiconductor switch. Before the diode can take up voltage, the storage charge has to be depleted. This causes a power loss both in the diode and in the semiconductor switch.

Reliable operation of the freewheeling diode can be ensured by means of a sufficiently slow switch-on speed of the active semiconductor switch. The power loss that arises has to be taken into account in the converter dimensioning. This leads to an increased cooling outlay or to an enlarged chip area of the power semiconductors or limits the operating frequency of the converter.

Hitherto, PIN diodes and—at lower voltages—Schottky diodes based on silicon have been used in voltage source converters.

Independently of and without reference to voltage source converters, various types of MOS (Metal Oxide Semiconductor)-controlled diodes (MCDs) are known from Schröder (Schröder, Dierk: "Elektrische Antriebe3—Leistungselektronische Bauelemente" ["Electrical drives 3—Power electronic components"], Springer-Verlag, Berlin, 1996, pages 373 to 377). Various types of MCDs are disclosed. In all of the MCDs described, a switchover between two states of the component is effected by means of a MOS control head, that is to say a gate electrode fitted in an insulated manner above the semiconductor material. Said states can be characterized as follows:

State 1: low forward resistance, high storage charge, blocking ability

State 2: high forward resistance, low or no storage charge, no or only little blocking ability In state 1, all of the MCDs described behave like a PIN diode with a highly doped p-type region, that is to say that the component is readily conductive in the case of forward-biasing. Furthermore, it is capable of blocking, but a high storage charge has to be depleted in the transition from the forward direction to the reverse direction.

In state 2, the MCDs described behave, depending on the embodiment, like a switched on MOSFET or like a Schottky diode, that is to say poorer conductivity in the case of forward-biasing than in state 1, no or—on account of the Schottky contact—only little blocking ability, although also no or only low storage charge which has to be depleted when there is a change in the current direction.

All of the MCDs described are constructed in such a way that, as a result of the application of a gate voltage, a p- or n-doped semiconductor region is bridged by an n- or p-conducting channel. The switchover of the MCDs thus causes the conductive channel to be established or removed. In state 2, the pn junction is thereby "bypassed" by an alternative current path. The pn junction is therefore incapable of blocking in state 2. State 2 of the MCD is thus characterized by no or—in the case of behavior like a Schottky diode—by only little blocking ability.

Since state 1 has the lower forward resistance, this state should be set in the case of forward-biasing. In the case of reverse-biasing, the MCD can only be in state 1, since state 2 has no or only little blocking ability and can therefore take up no or only a low voltage. However, the MCD should be in state 2 where there is a change in the current direction, that is to say when there is a transition from the case of forward-biasing to the case of reverse biasing, since this state, in contrast to state 1, has no or only a low storage charge. When there is a change in the current direction, that is to say when there is a transition from the case of forward-biasing to the case of reverse-biasing, therefore, the MCD should—in order to achieve an optimum behavior of the MCD—initially be in state 1, and then be switched over to state 2, the change in the current direction should then be effected, and the switchover to state 1 should subsequently be effected, in order to realize the blocking.

What is disadvantageous about these MCDs described in Schröder is that the above-described method for realizing the optimum transition of the MCDs from the case of forward-biasing to the case of reverse-biasing is very complicated and reacts critically to the temporal sequence of the control pulses.

SUMMARY OF THE INVENTION

Therefore, the invention is based on the object of specifying a novel semiconductor diode in which it is possible to switch over between states having a different forward resistance and a different storage charge, but the optimum transition of the semiconductor diode from the case of forward-biasing to the case of reverse-biasing is simplified and is thus less critical with regard to the temporal sequence of the control pulses. It is furthermore an object of the invention to integrate this semiconductor diode into an electronic component.

Furthermore, the intention is to specify a voltage source converter in which the storage charge that has to be depleted from the freewheeling diode during a commutation operation and thus the switching energy loss are reduced in order thereby to enable a higher switch-on speed of the voltage source converter. Moreover, it is an object of the invention to specify a control method for a voltage source converter of this type. In accordance with one aspect of the present invention, a semiconductor diode includes a first region of a predetermined conduction type, a second region having an opposite conduction type in comparison with the first region, a pn junction formed between the first region and the second region, a first electrode, which is in direct electrical contact with the first region, that is to say forms an ohmic contact in particular with the latter, a second electrode, which is in direct electrical contact with the second region, that is to say forms an ohmic contact in particular with the latter, a gate electrode, which is arranged in the region of the pn junction and/or first region in a manner isolated from the first region and/or second region by an insulation layer, in which case, by applying a voltage between first electrode and gate electrode, the majority charge carrier concentration in the first region can be altered, that is to say can be increased or decreased.

Predetermined conduction type in the case of the first region is to be understood here to mean that the first region is composed of a p-doped or an n-doped semiconductor material. Opposite conduction type in the case of the second region means that the second region is doped oppositely to the first region, that is to say the second region is n-doped given p-type doping of the first region, and vice-versa.

First electrode, second electrode and gate electrode may be composed of metal. Gate electrode, insulation layer and the semiconductor material of the first and second regions form an MIS (Metal Insulator Semiconductor) contact. Since the voltage present between the gate electrode and the first electrode controls the majority charge carrier concentration in the first region, the MIS contact is also referred to as an MIS control head. Consequently, an MIS-controlled diode is involved overall. In addition to the control of the majority charge carrier concentration by the MIS control head in the first region, the charge carrier concentration in the second region is automatically concomitantly set as well.

Preferably, the majority charge carrier concentration in the first region may be altered by a factor lying in the range of 5 to 100 by application of a voltage between first electrode and gate electrode.

The invention with regard to the semiconductor diode is based on the consideration of specifying a semiconductor diode having at least one pn junction, which can be switched over between a first state and a second state, a. the second state having a greater forward resistance in comparison with the first state, and b. the second state having a smaller storage charge in comparison with the first state, and c. the pn junction being capable of blocking both in the first state and in the second state with in each case at least one predetermined blocking ability.

The advantage obtained by means of the invention consists, in particular, in the fact that in a diode which can be switched over between states having a different forward resistance and a different storage charge, the optimum transition of the semiconductor diode from the case of forward-biasing to the case of reverse-biasing is simplified and is thus less critical with regard to the temporal sequence of the control pulses. This advantage is based on the fact that the semiconductor diode according to the invention has a pn junction which is capable of blocking in both states with at least one blocking ability predetermined for each state, and the semiconductor diode thus effects blocking in both states in the case of reverse-biasing. In this case, blocking ability is to be understood to mean that in the case of reverse-biasing, that is to say in the case where voltage is present in the reverse direction across the diode, the diode can take up voltage and only at most an extremely small reverse current flows. The magnitude of the blocking ability can be defined by the breakdown voltage in the case of reverse-biasing.

In accordance with one development, the blocking ability of the semiconductor diode is characterized by the fact that, in the case of reverse-biasing, the breakdown voltage in the first state and in the second state of the semiconductor diode is at least 100 V, preferably at least 1000 V.

An expedient embodiment of the invention provides for the blocking ability, characterized by the breakdown voltage in the case of reverse-biasing, to be of the same order of magnitude in the first and second states of the semiconductor diode, that is to say the rounding to the next power of ten leads to the same result.

An advantageous embodiment of the invention provides for the semiconductor diode to comprise a gate electrode and a first electrode, and for the switchover between the first state and the second state of the semiconductor diode to be effected by changing a voltage present between gate electrode and first electrodes.

The aforementioned states may be characterized as follows;

First state: low forward resistance, high storage charge, blocking ability

Second state: high forward resistance, low storage charge, blocking ability

The relative indications "low" and "high" here relate in each case to the same feature in the other state.

The difference from the MOS-controlled diodes known from the prior art resides, in particular, in the fact that the diode according to the invention also has a pn junction with a blocking ability in the second state, which otherwise corresponds to state 2 in accordance with the prior art. When there is a change in the current direction, that is to say when there is a transition from the case of forward-biasing to the case of reverse-biasing, therefore, the MIS-controlled diode according to the invention should—in order to achieve an optimum behavior of the MIS-controlled diode—initially be in the first state (state 1 in the case of the prior art) as in the case of the MOS-controlled diode in accordance with the prior art and then be switched over to the second state (state 2 in the case of the prior art). The change in the current direction is then effected. However, the immediate switchover to state 1 in accordance with the prior art is now obviated since, in contrast to the prior art, the MIS-controlled diode according to the invention also has a pn junction with a blocking ability in the second state and, therefore, the blocking is also realized in the second state. As a result, the optimum transition of the semiconductor diode from the case of forward-biasing to the case of reverse-biasing is simplified and is thus less critical with regard to the temporal sequence of the control pulses.

While all of the MOS-controlled diodes described by Schröder are constructed in such a way that state 2, in contrast to state 1, is determined by the establishment of a conductive channel and a resultant opening of a current path past the pn junction, the states in the MIS-controlled semiconductor diode according to the invention are defined by a different majority charge carrier concentration in the first region. In this case, the pn junction is not "bypassed" by an alternative current path. As a result, the blocking ability of the pn junction of the diode is also present in both states.

In accordance with one development of the semiconductor diode according to the invention, the gate electrode neither covers the first region as far as the first electrode nor covers the second region as far as the second electrode.

An advantageous refinement of the invention provides for the first region and/or the second region of the semiconductor diode to be formed as a layer.

It may furthermore be provided that the insulation layer between gate electrode and first region and/or second region is an oxide layer. The MIS contact of the semiconductor diode is thus a MOS contact in this concretized design.

In accordance with one embodiment of the invention, it is provided that the first region comprises a first partial region, which adjoins the first electrode, and a second partial region, which adjoins the second region and forms the pn junction with the latter, the doping in the first partial region being higher than the doping in the second partial region. It may additionally be provided in this case that the gate electrode is arranged only in the region of the first partial region of the first region.

In a further refinement of the semiconductor diode, it is provided that the second region comprises a first partial region, which adjoins the first region and forms the pn junction with the latter, and a second partial region, which adjoins the second electrode, the doping in the first partial region being lower than the doping in the second partial region. Structures of this type are customary in components appertaining to power electronics in order to obtain the required breakdown strength. In accordance with an expedient embodiment, the first partial region and/or the second partial region of the second region may be formed as a layer.

A first embodiment variant of the invention provides for the doping in the first region to be less than the doping in the second partial region of the second region.

A further development of this first embodiment variant provides for the second partial region of the second region to be pervaded, in the region between second electrode and first partial region of the second region, by islands whose charge type is opposite to the charge type of the second region.

In accordance with a second embodiment variant of the invention, the doping in the first region is greater than the doping in the second partial region of the second region.

One development of the semiconductor diode provides for the first region to be an n-doped region. The second region is accordingly p-doped. In the case where the second region is divided into two, the first partial region is thus a p-minus-doped partial region and the second partial region is a p-plus-doped partial region. In the case where the first region is n-doped, the first electrode is a cathode, and the second electrode is an anode.

In accordance with an alternative development of the semiconductor diode according to the invention, the first region is a p-doped region. The second region is accordingly n-doped. In the case where the second region is divided into two, the first partial region is thus an n-minus-doped partial region and the second partial region is an n-plus-doped partial region. In the case where the first region is p-doped, the first electrode is an anode, and the second electrode is a cathode. A voltage applied between gate electrode and first electrode may therefore be designated by gate-anode voltage uGA.

If consideration is given to the abovementioned first embodiment variant of the invention in the case where the first region is p-doped, then a semiconductor diode of this type, without application of a gate-anode voltage, is in the second state defined above, that is to say it is characterized by a high forward resistance and low storage charge in relation to the first state. The doping profile and the charge carrier lifetime are expediently set in such a way that the diode has a soft reverse recovery behavior in this state, that is to say that the decay of the tail current is effected in a relatively soft manner. As a result of the application of a negative gate-anode voltage, the hole concentration in the p-doped first region is increased and the diode is then in the first state, that is to say it has a low forward resistance and a high storage charge in relation to the second state. The switchover between the states of the diode is thus effected by switching on or turning off a negative gate-anode voltage.

If consideration is given to the above-described further development of the first embodiment variant in the case where the first region is p-doped, then the second partial region of the second region is highly n-doped in comparison with the first partial region. This highly n-doped second partial region is pervaded by p-type islands. This has the advantage that when the semiconductor diode undergoes transition from the first to the second state, the holes in the lightly n-doped first partial region of the second region are depleted more rapidly.

If consideration is given to the above-described second embodiment variant of the invention in the case where the first region is p-doped, then the p-type doping in the first region is greater than the n-type doping in the second partial region of the second region. Without application of the gate-anode voltages, the semiconductor diode is in the first state defined above, which is characterized by a low forward resistance and a high storage charge in comparison with the second state. As a result of the application of a positive gate-anode voltage, the hole concentration in the p-doped first region is decreased, and the diode then has a high forward resistance and a low storage charge, and so is in the second state.

An n-type doping of the first region leads to analogous considerations except that the respective conduction type indications (n and p) have to be interchanged.

In an expedient technological design, the semiconductor diode according to the invention is realized in a planar structure. In a particularly advantageous alternative configuration, the diode is realized in a trench structure, that is to say as a trench element, or in a MESA structure.

The first and/or the second region of the semiconductor diode according to the invention may be produced on the basis of silicon or silicon carbide SiC or gallium arsenide GaAs. The insulation layer between gate electrode and first region and/or second region may comprise silicon oxide.

In accordance with one development of the invention, it is provided that the semiconductor diode is assigned a control device for applying a voltage between first electrode and gate electrode. A control device of this type enables the controlled switchover of the semiconductor diode between first and second state by controlling the voltage present.

According to another aspect of the present invention, an electronic component includes at least one chip which comprises a plurality of the semiconductor diodes according to the invention as cells. This chip is designated as chip of a first type.

In accordance with an advantageous refinement of the electronic component according to the invention, provision is made for integrating at least one chip of a first type and at least one chip which comprises a plurality of turn-off power semiconductors as cells in a module housing. Chips having a plurality of turn-off power semiconductors are designated as chips of a second type.

If required, two or more chips of a first type may be connected in parallel in the module housing. As an alternative or in addition, in the module housing it is also possible for one or more chips of a first type to be connected up to one or more chips of a second type to form an individual switch and/or a half-bridge (phase) and/or a plurality of phases.

An advantageous refinement of the electronic component with module housing provides for the gate terminal of each semiconductor diode of the chips of a first type to be in each case led from the module housing separately from the gate terminal of the turn-off power semiconductor of the chips of a second type that is assigned to said diode, and is in each case provided with a contact-making location.

In accordance with an alternative refinement of the electronic component with module housing, it is provided that the gate terminal of each semiconductor diode of the chips of a first type and the gate terminal of the turn-off power semiconductor of the chips of a second type that is assigned to said diode are already connected within the module housing, so that there is only one contact-making location for the user, that is to say externally.

One development provides for an auxiliary emitter terminal or an auxiliary cathode terminal and/or an auxiliary anode terminal or an auxiliary collector terminal to be provided for the turn-off power semiconductor in the electronic component with module housing. A design in which the auxiliary emitter terminal or the auxiliary cathode terminal of the turn-off power semiconductor is connected to the auxiliary anode terminal of the semiconductor diode assigned to said turn-off power semiconductor is then advantageous.

Auxiliary terminals are to be understood here to mean terminals in the case of which only a small control current flows, in contrast to power terminals.

In a further embodiment of the electronic component with module housing, in addition to the one or more chips of a first type and the one or more chips of a second type, the drive circuits or parts of the drive circuits for the semiconductor diodes of the chips of a first type and/or the turn-off power semiconductors of the chips of a second type are also integrated into the module housing.

According to another aspect of the present invention a voltage source converter includes at least one semiconductor diode and at least one power semiconductor. In this case, the semiconductor diode includes at least one pn junction and can be switched over between a first state and a second state, a) the second state having a greater forward resistance in comparison with the first state, and b) the second state having a smaller storage charae in comparison with the first state, and c) the pn iunction being capable of blocking both in the first state and in the second state with in each case at least one predetermined blocking ability. Any semiconductor diode according to the invention, in particular any of the of the embodiment variants and developments described may be used here as the semiconductor diode.

The use of the semiconductor diodes according to the invention affords the advantage that, by switching over between first and second states, the advantages of the respective state can be utilized in a targeted manner in accordance with the different switching phases of the voltage source converter.

In accordance with one development of the voltaae source converter, the blocking ability of the semiconductor diode is characterized by the fact that, in the case of reverse-biasing, the breakdown voltaae in the first state and in the second state is at least 100 V, preferably at least 1000V.

An expedient embodiment of the voltaae source converter according to the invention furthermore provides for the blocking ability of the semiconductor diode, characterized by the breakdown voltaae in the case of reverse-biasing, to be of the same order of magnitude in the first and second states of the semiconductor diode.

An advantageous embodiment of the voltaae source converter provides for the semiconductor diode to comprise a gate electrode and a first electrode, and for the switchover between the first state and the second state of the semiconductor diode to be effected by changing a voltaae present between gate electrode and first electrode.

In a further development of the voltage source converter according to the invention, the semiconductor diodes are connected up in such a way that they are assigned in each case as a freewheeling diode to a turn-off power semiconductor.

This combination affords the advantage that the storage charge that has to be depleted during a commutation operation from the freewheeling diode to the turn-off power semiconductor and thus the switching energy loss can thereby be reduced given corresponding driving of the states of the semiconductor diode. This leads to a reduced power loss of the converter and thus enables smaller power semiconductor areas and also a lower cooling outlay.

In an advantageous embodiment, the voltage source converter comprises at least one subsystem for converting a phase of the output alternating-current system, which comprises two semiconductor diodes according to the invention and two turn-off power semiconductors.

In this case, the turn-off power semiconductors may be MOSFETs and/or IGBTs and/or bipolar transistors and/or GTOs and/or IGCTs.

The voltage source converter according to the invention may be a two-point converter or a three-point converter or some other multipoint converter. The number of phases is arbitrary in each case.

A particularly advantageous development provides for the turn-off power semiconductors to be connected in series. In this case, the reduced storage charge of the MIS-controlled diodes leads to a simplified voltage balancing between the power semiconductors.

Both the turn-off power semiconductor and the assigned freewheeling diode generally require a drive circuit. In an expedient refinement of the voltage source converter according to the invention, the drive functions of a power semiconductor and of the respectively assigned semiconductor diode are integrated in a common drive circuit. This integration of the drive functions may be realized for one or for a plurality of turn-off power semiconductors.

It may furthermore be provided that the common drive circuit is distinguished by a common voltage supply. In accordance with one development, the common voltage supply may be effected by means of an AC voltage source, a downstream transformer and a downstream rectification.

As an alternative or in addition, it may furthermore be provided that the common drive circuit is distinguished by a common drive signal transmission. In accordance with one development, the common drive signal transmission may be effected by means of optocouplers and/or optical waveguides and/or pulse transformers, that is to say small transformers for signal transmission.

According to another aspect of the present invention, a control method for the voltage source converter according to the invention is based on the consideration of coordinating the driving of the power turn-off semiconductors and of the assigned semiconductor diodes according to the invention with one another in terms of their temporal sequence. This means that the switchover of the semiconductor diode between first and second states is in a defined temporal relationship with the switch-on or switch-off of the assigned power turn-off semiconductor. Furthermore, in the case of a plurality of power turn-off semiconductors and semiconductor diodes in a voltage source converter, the switching operations of all the components are coordinated with one another.

In a first embodiment of this control method, a switchover of the semiconductor diodes between the first state and second state is effected in a temporal relationship with the switch-off and/or with the switch-on of the assigned turn-off power semiconductors.

In an advantageous development of this second embodiment of the control method, in a voltage source converter having a first power turn-off semiconductor and a second power turn-off semiconductor and also a first semiconductor diode according to the invention assigned to the first power turn-off semiconductor, and a second semiconductor diode according to the invention assigned to the second power turn-off semiconductor, it is provided that initially the first power turn-off semiconductor is switched on, the second power turn-off semiconductor is switched off, the first semiconductor diode is in the first state and the second semiconductor diode is in the second state, the first semiconductor diode is switched from the first state to the second state at a first instant, the first power turn-off semiconductor is switched off at a second instant, the second power turn-off semiconductor is switched on at a third instant, and the first semiconductor diode is switched back from the second state to the first state at a fourth instant.

In this case, first and second semiconductor diode are characterized in accordance with the above explanations concerning the voltage source converter.

After carrying out this first embodiment of the control method, the first turn-off power semiconductor is thus switched off, the second turn-off power semiconductor is switched on, the first semiconductor diode is in the second state and the second semiconductor diode is in the first state.

In the case of this first embodiment of the control method, in the temporal sequence of the individual steps, the first instant may precede the second instant or the second instant may precede the first instant.

In a first variant of the first embodiment of the control method, in the temporal sequence of the individual steps, the third instant may precede the fourth instant or the fourth instant may precede the third instant. Furthermore, in the case of this first variant, in the temporal sequence of the individual steps, the first instant and the second instant precede the third instant and the fourth instant, that is to say the later of the first and second instants precedes the earlier of the third and fourth instants. In the case of this first variant of the first embodiment of the control method, a blocking ability of the semiconductor diodes in the first state is not absolutely necessary, that is to say that this variant of the control method can also be carried out with other types of semiconductor diodes.

In a second variant of the first embodiment of the control method, in the temporal sequence of the individual steps, the fourth instant precedes the second instant.

In a second embodiment of the control method, a switchover of the semiconductor diodes between the first state and second state is effected in a temporal relationship with the switch-off of the assigned turn-off power semiconductors. A switchover of the semiconductor diodes is not necessary when switching on the assigned turn-off power semiconductors in the case of the second embodiment.

In an advantageous development of this first embodiment of the control method, in a voltage source converter having a first power turn-off semiconductor and a second power turn-off semiconductor and also a first semiconductor diode according to the invention assigned to the first power turn-off semiconductor, and a second semiconductor diode according to the invention assigned to the second power turn-off semiconductor, it is provided that initially the first power turn-off semiconductor is switched on, the second power turn-off semiconductor is switched off, the first semiconductor diode is in the first state and the second semiconductor diode is in the second state, the first semiconductor diode is switched from the first state to the second state at a first instant, the first power turn-off semiconductor is switched off at a second instant, the second power turn-off semiconductor is switched on at a third instant, and the second semiconductor diode is switched from the second state to the first state at a fourth instant.

In this case, first and second semiconductor diode are characterized in accordance with the above explanations concerning the voltage source converter.

After carrying out this second embodiment of the control method, the first turn-off power semiconductor is thus switched off, the second turn-off power semiconductor is switched on and the first semiconductor diode is in the first state, as at the beginning. The second semiconductor diode remains in the first state unchanged through out the control method.

In a first variant of the second embodiment of the control method, in the temporal sequence of the individual steps, the first instant and the second instant precede the third instant and the third instant precedes the fourth instant. In this case, in the temporal sequence of the individual steps, the first instant may precede the second instant or the second instant may precede the first instant.

In a second variant of the second embodiment of the control method, in the temporal sequence of the individual steps, the first instant precedes the second instant. Furthermore, in the case of this second variant, in the temporal sequence of the individual steps, the fourth instant precedes the third instant. If the first turn-off power semiconductor carries current, it is furthermore provided that, in the temporal sequence of the individual steps, the fourth instant precedes the second instant. In the case of this second variant of the second embodiment of the control method, a blocking ability of the semiconductor diodes in the second state is not absolutely necessary, that is to say that this variant of the control method can also be carried out with other types of semiconductor diodes.

In an advantageous development of both the first and the second embodiment of the control method, it is provided that the switchover—subsequent to the switchover from the first turn-off power semiconductor to the second turn-off power semiconductor—back from the second turn-off power semiconductor to the first turn-off power semiconductor proceeds in accordance with the operation of switching over from the first turn-off power semiconductor to the second turn-off power semiconductor. In the description of the individual steps, it is then necessary only in each case to replace the first turn-off power semiconductor by the second turn-off power semiconductor, and vice-versa, and also the first semiconductor diode by the second semiconductor diode, and vice-versa.

BRIEF DESCRIPTION OF THE DRAWING

The invention is explained in more detail below inter alia on the basis of exemplary embodiments. In this case, reference is made to the drawings, in which.

DETAILED DESCRIPTION OF PREFERRED EMBODIMENTS

Figure 1:
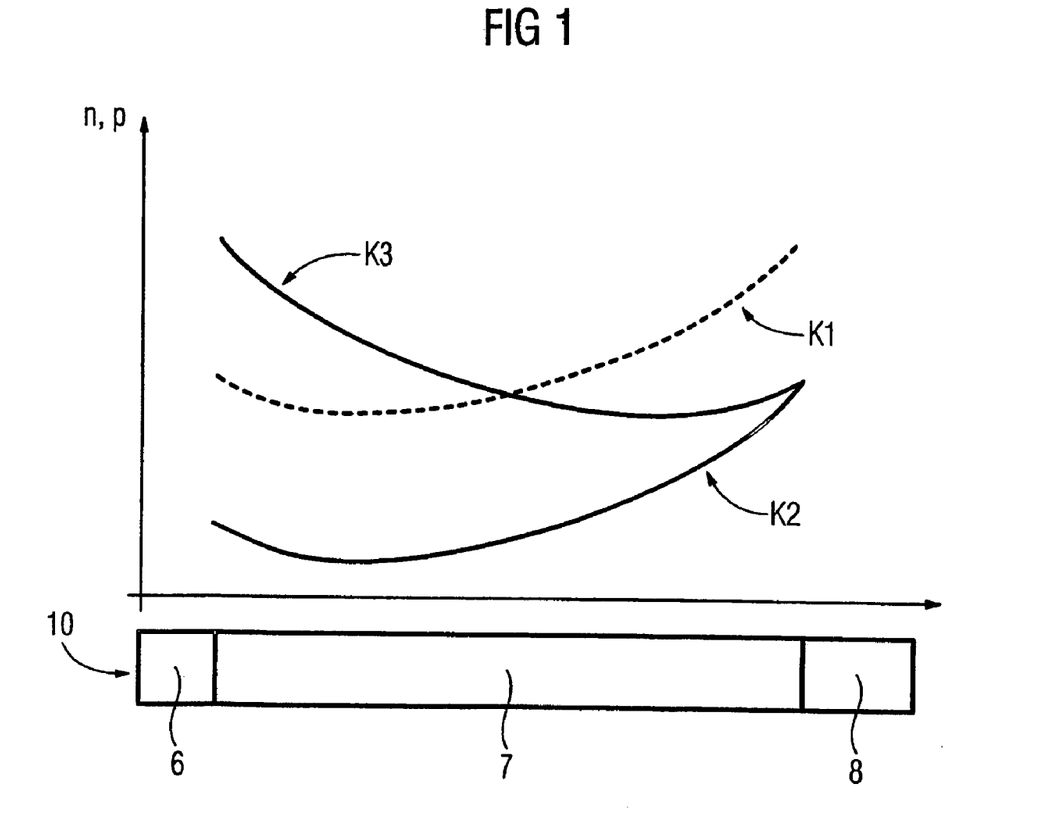
FIG. 1 shows a comparison of the charge carrier distribution in a conventional diode with the charge carrier distribution in an exemplary embodiment of the semiconductor diode according to the invention.

FIG. 1 shows, by way of example, the charge carrier distribution n,p in the switched-on state in the case of a conventional PIN diode, that is to say a diode having the construction: p-type region—Intrinsic layer ("internal layer", here n-minus-doped)—n-type region, and also in the case of a three-layered semiconductor diode according to the invention in accordance with the above-described first embodiment variant in the case where the first region 6 is p-doped, that is to say with a first region 6 that is lightly p-doped in comparison with the doping of the n-plus-doped region 8, in the state without an applied gate-anode voltage uGA (uGA=0 V) and in the state of a negative gate-anode voltage uGA (uGA<0 V). The p-doped region 6 is the first region in this case. The n-minus-doped region 7 is the first partial region and the n-plus-doped region 8 is the second partial region of the second region 7, 8.

A schematic section through a diode 10 is illustrated in the lower region of FIG. 1. The p-doped region 6 is situated in the left-hand region of this sectional drawing of the diode 10. In the case of the first embodiment variant illustrated here, said p-doped region is lightly doped relative to the n-plus-doped region 8. Said p-doped region 6 is adjoined by a—in comparison with the other regions—wide n-minus-doped region 7. "n-minus" means that this region is lightly doped relative to the n-plus-doped region 8. The n-plus-doped region 8 adjoins the n-minus-doped region 7 on the right.

Above this schematic section through a diode 10, the charge carrier distribution n,p is illustrated in the form of an x-y diagram in FIG. 1. In this case, the x axis represents the position in the diode 10 depicted schematically underneath, and the magnitude of the charge carrier concentration n,p can be read on the y axis.

Three charge carrier distributions are illustrated in the x-y diagram. The curve designated by K1 represents the charge carrier distribution in a conventional PIN diode, the curve designated by K2 represents the charge carrier distribution in a three-layered semiconductor diode—p-doped in the first region 6—according to the invention in accordance with the first embodiment variant with no applied gate-anode voltage uGA (uGA=0 V), and the curve designated by K3 represents the charge carrier distribution in the same semiconductor diode according to the invention with a negative gate-anode voltage uGA (uGA<0 V). Negative gate-anode voltage means that the gate of the diode is given negative polarity with respect to the anode of the diode.

With a negative gate-anode voltage uGA (uGA<0 V), in the example illustrated, the semiconductor diode according to the invention has the same forward resistance as the conventional PIN diode (comparison of curves K1 and K3). However, the charge carrier concentration n,p of the semiconductor diode according to the invention in the entire n-minus region 7, with no applied gate-anode voltage (uGA=0 V), is significantly less than the charge carrier concentration n,p of the conventional diode in the n-minus region 7. This is shown by the comparison of the curve K1 with the curve K2 in FIG. 1. The storage charge in the diode according to the invention is thus significantly reduced in comparison with the storage charge of the conventional PIN diode.

FIG. 1 furthermore shows that not only the majority charge carrier concentration in the p-type region 6 (not illustrated) but also the charge carrier concentration n, p on the anode side of the n-minus-doped region 7 can be set through application of the gate-anode voltage in the diode according to the invention. This is shown by the comparison of the curve K2 with the curve K3. In this case, the anode side of the n-minus-doped region 7 is the side adjoining the p-doped region 6, the left-hand side of the n-minus-doped region 7 in FIG. 1. On the right-hand side of the n-minus-doped region 7, that is to say on the cathode side, the charge carrier concentration is essentially identical in magnitude in both states of the diode according to the invention, that is to say when uGA=0 V and when UGA<0 V. However, the nearer a region in the n-minus-doped region 7 is to the left-hand side, that is to say to the anode side, the greater the difference in the charge carrier concentration n,p between the two states of the diode according to the invention, that is to say when uGA=0 V and when uGA<0 V. When uGA<0 V, the charge carrier concentration n,p on the anode side of the n-minus-doped region 7 is significantly greater than the charge carrier concentration n,p when uGA=0 V. On the anode side of the n-minus-doped region 7 it is even significantly greater than the charge carrier concentration n,p of the conventional PIN diode.

It goes without saying that other charge carrier distributions can also be set in other exemplary embodiments of the semiconductor diode according to the invention with a p-doped first region 6. However, it is always characteristic that the charge carrier concentration on the anode side of the n-minus-doped region 7 can be set through application of a gate-anode voltage.

By setting the gate-anode voltage, therefore, besides the primary aim of the alteration of the majority charge carrier concentration in the p-doped region 6, and the associated influencing of the storage charge, the charge carrier concentration in the anodal region of the n-minus-doped region 7 is also altered. As a result, the storage charge of the diode is likewise influenced, to be precise analogously to the influencing in the p-doped region, that is to say reduction of the storage charge in the p-doped region 6 also results in a reduction of the storage charge in the n-minus-doped region 7, and vice-versa.

Figure 2:
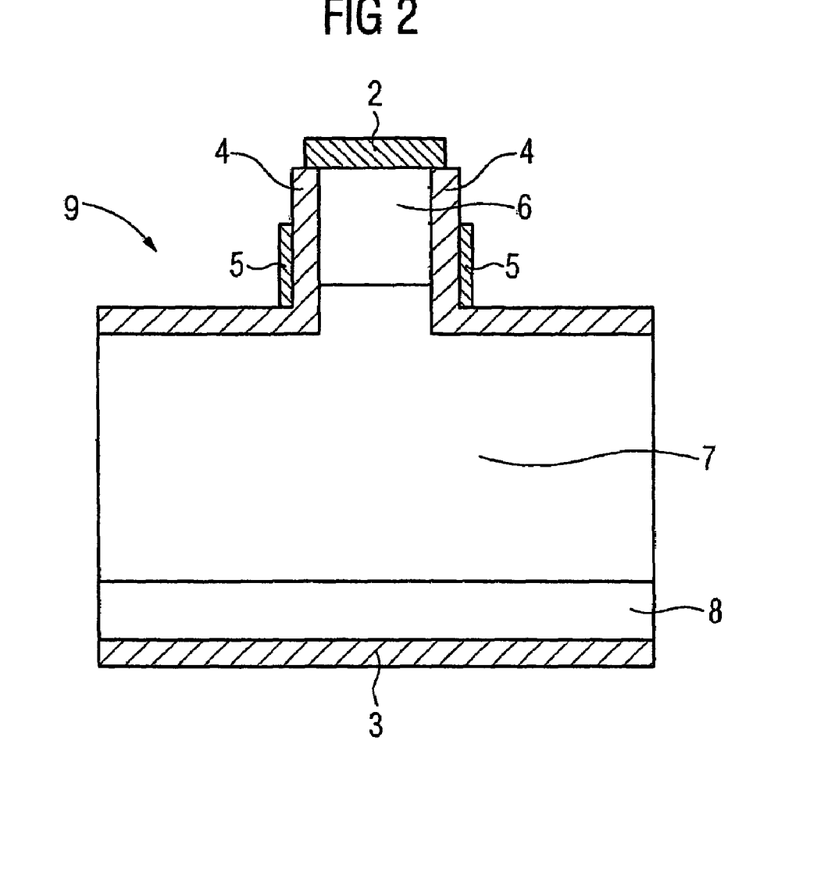
FIG. 2 shows a concrete exemplary embodiment of a semiconductor diode according to the invention that is realized as a trench element.

FIG. 2 shows a basic cross section through a possible embodiment of a cell of a diode 9 according to the invention. In the embodiment illustrated, the diode 9 is realized as a trench element. The illustrated diode 9 according to the invention is composed of a p-doped region 6, an adjacent n-minus-doped region 7 and an n-plus region 8 adjoining on the opposite side of the n-minus-doped region 7 from the p-doped region 6. Furthermore, the diode comprises the cathode, which is arranged on the n-plus-doped region 8 on the opposite side from the n-minus-doped region 7 and extends over the complete side, and also the anode, which is arranged on the p-doped region 6 on the opposite side from the n-minus-doped region 7. The p-doped region 6 and also that part of the n-minus-doped region which adjoins the p-doped region have a significantly smaller area than the remaining region of the n-minus-doped region 7 and the adjoining n-plus-doped region 8. The surface of the n-minus-doped region 7 that is free on account of the reduced area and also the free sides of the p-doped region 6 are completely covered by an oxide layer 4. Outside the oxide layer 4, the gate 5 is arranged in the region of the junction between p-doped region 6 and n-minus-doped region 7. Gate 5, oxide layer 4 and p-doped region 6 and n-minus-doped region 7 thus form a MOS contact. The charge carrier concentration in the p-doped region 6 can be influenced by the application of a voltage between gate 5 and anode 2. Different states of the semiconductor diode 9 can thus be set. The semiconductor diode illustrated is thus a MOS-controlled diode.

Silicon can be used as semiconductor material for all of the regions; the oxide layer then comprises silicon oxide. Anode 2, cathode 3 and gate 5 are composed of metal.

Figure 3:
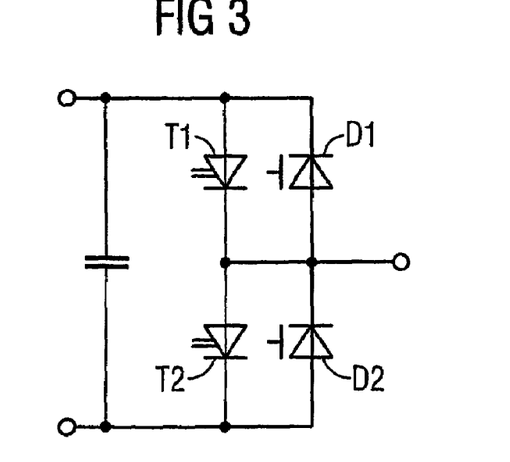
FIG. 3 shows the circuit diagram of an exemplary embodiment of a voltage source converter with turn-off power semiconductors and semiconductor diodes according to the invention.

FIG. 3 shows the circuit diagram of a voltage source converter, here in the form of a half-bridge, with turn-off power semiconductors and semiconductor diodes according to the invention. The circuit diagram contains two turn-off power semiconductors, designated by T1 and T2, and also two semiconductor diodes, designated by D1 and D2.

Figure 4:
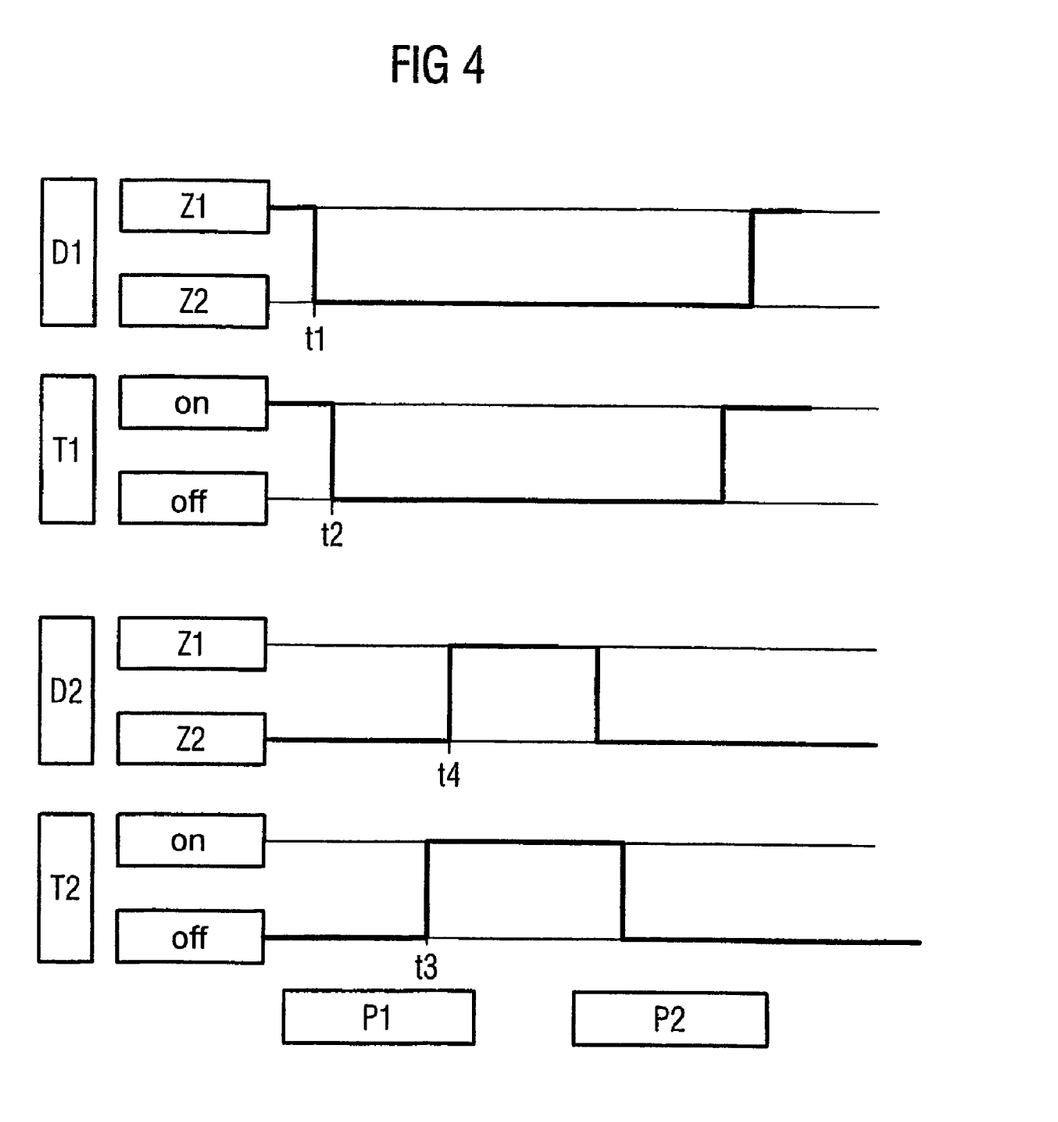
FIG. 4 shows the switching sequence of a control method in accordance with the first embodiment.
Figure 5:
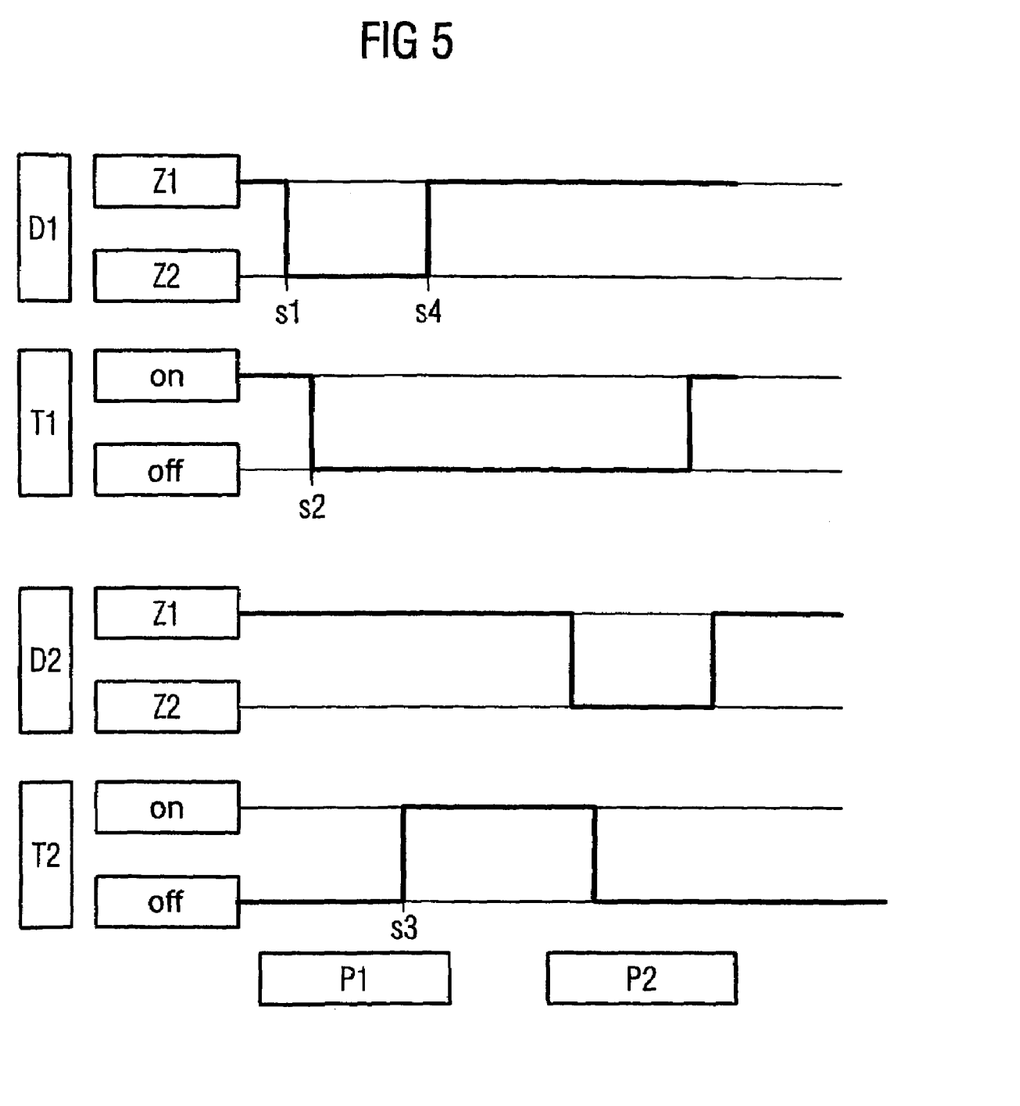
FIG. 5 shows the switching sequence of a control method in accordance with the second embodiment.

FIG. 4 and FIG. 5 show, by way of example, a possible embodiment of a control method for the voltage source converter illustrated as a circuit diagram in FIG. 3. The semiconductor diodes D1 and D2 and also the turn-off power semiconductors T1 and T2 are specified as individual components of the voltage source converter. D1 is the freewheeling diode assigned to T1, and D2 is the freewheeling diode assigned to T2. The two states between which switching back and forth is effected in the course of the control method are respectively specified for each of these components D1, T1, D2, T2. These are the states Z1 and Z2 in the case of the diodes D1 and D2. In this case, Z1 designates the state of the semiconductor diode with low forward resistance and high storage charge, and Z2 designates the state of the semiconductor diode with high forward resistance and low storage charge. The semiconductor diodes D1 and D2 have blocking ability in both states. The two turn-off power semiconductors T1 and T2 can be switched on and off. The switched-on state is respectively designated by "on", and the switched-off state by "off".

Toward the right, the illustration shows the respective switching state for the components D1, T1, D2, T2 in the temporal progression by means of corresponding line tracing. In this case, in the switching phase designated by P1, the illustration shows the control method when switching over from T1 to T2 and, in the switching phase designated by P2, the illustration shows the control method when switching over from T2 to T1. The switchover instants for the individual components are designated in the switching phase P1, that is to say when switching over from T1 to T2, by t1, t2, t3 and t4 in FIG. 4 and by s1, s2, s3 and s4 in FIG. 5. The control method in the switching phase designated by P2, that is to say when switching over from T2 to T1, proceeds in accordance with the switchover operation from T1 to T2 (phase P1) both in FIG. 4 and FIG. 5. The switching states of the individual components D1 and D2 and also T1 an T2 are merely interchanged relative to one another, that is to say that the switching states of D1 in the phase P2 correspond in the temporal progression to the switching states of D2 in phase P1, and vice-versa. The switching states of T1 in phase P2 analogously correspond in their temporal progression to the switching states of T2 in phase P1, and vice-versa.

The control method illustrated in FIG. 4 illustrates the control method that has already been described as a first embodiment. It is provided in this case that the switchover of the semiconductor diodes D1, D2 between the first state Z1 and second state Z2 is effected in a temporal relationship with the switch-off and with the switch-on of the assigned turn-off power semiconductors T1, T2.

The individual steps in phase P1 that are illustrated in FIG. 4 appear as follows:
  i. instant t1: D1 is switched from state Z1 to state Z2;
  ii. instant t2: T1 is switched off;
  iii. instant t3: T2 is switched on;
  iv. instant t4: D2 is switched from state Z2 to state Z1.

In accordance with the already described first variant of the first embodiment of the control method, in the temporal sequence of the individual steps, the two instants t1 and t2 precede the instants t3 and t4. By contrast, the instant t2 may precede or succeed the instant t1. Moreover, in the temporal sequence of the individual steps, the instant t3 may precede or succeed the instant t4. In the illustration in FIG. 4, the following holds true in concrete terms for an example of the first embodiment: t1<t2<t3<t4, that is to say that t1 precedes t2, t2 precedes t3 and t3 precedes t4.

In the described second variant of the first embodiment of the control method, in the temporal sequence of the individual steps, the instant t4 precedes the instant t2. By contrast, the instant t2 may precede or succeed the instant t1 in this case as well.

The control method illustrated in FIG. 5 illustrates the control method that has already been described as the second embodiment. In this case, it is provided that the instant of the switchover of each of the semiconductor diodes D1 and D2 between state Z1 and state Z2 is in a defined temporal relationship with the switch-off of the assigned turn-off power semiconductor T1 or T2. By contrast, when the turn-off power semiconductor T1 or T2 is switched on, the assigned semiconductor diode D1 or D2 is not switched over.

The individual steps in phase P1 that are illustrated in FIG. 5 appears as follows:
  i. instant s1: D1 is switched from state Z1 to state Z2;
  ii. instant s2: T1 is switched off;
  iii. instant s3: T2 is switched on;
  iv. instant s4: Dl is switched from state Z2 to state Z1 and is thus in the initial state again.

D1 has thus been switched twice in the defined temporal relationship with the switch-off of T1; by contrast, the freewheeling diode D2 assigned to T2 has not been switched in the temporal relationship with the switch-on of T2 and it is in the state Z1 throughout the phase P1.

In the case of the already described first variant of the second embodiment of the control method, in the temporal sequence of the individual steps, the two instants s1 and s2 precede the instants s3 and s4. By contrast, the instant s2 may precede or succeed the instant s1. Moreover, in the temporal sequence of the individual steps, the instant s3 must precede the instant s4. In the illustration in FIG. 5, the following holds true in concrete terms for an example of the second embodiment: s1<s2<s3<s4, that is to say that s1 precedes s2, s2 precedes s3 and s3 precedes s4.

In accordance with the already described second variant of the second embodiment of the control method, in the temporal sequence of the individual steps, the instant s4 precedes the instant s3 and the instant s1 precedes the instant s2. The instant s4 must precede the instant s2 if T1 carries current.

What is claimed is:

1. A voltage source converter comprising:
   at least one semiconductor diode cell including semiconductor diode having
   a) a first region of a given conduction type,
   b) a second region having an opposite conduction type relative to the first region,
   c) a pn junction formed between the first region and the second region,
   d) a first electrode in direct electrical contact with the first region,
   e) a second electrode in direct electrical contact with the second region, and
   f) a gate electrode isolated from at least one of said regions by an insulation layer and adapted to alter a concentration of a majority charge carrier in said first region when a voltage is applied between said first electrode and said gate electrode, to switch said semiconductor diode between a first state and a second state, said second state having a greater forward resistance and a smaller storage charge in comparison with said first state,
   wherein said pn junction is adapted to provide blocking in both said first and second states and having at least one given breakdown voltage characteristic in said first and second states; and
   at least one power turn-off semiconductor cell having at least one power turn-off semiconductor selected from the group consisting of MOSFET, IGBT, bipolar transistor, GTO, and IGCT, wherein said rower turn-off semiconductor cell and said semiconductor diode cell are adapted to be driven by a common drive circuit, and wherein a gate of the power turn-off semiconductor is connected to said gate electrode to switch the semiconductor diode between said first and second states.

2. The voltage source converter of claim 1, wherein said breakdown voltage in said first state and in said second state is at least 100 V when the semiconductor diode is reverse-biased.

3. The voltage source converter of claim 1, wherein said breakdown voltage of said semiconductor diode when said semiconductor diode is reverse biased is of the same order of magnitude in said first and second states.

4. The voltage source converter of claim 1, wherein changing a voltage between said gate electrode and said first electrode switches said semiconductor diode between said first and second states.

5. The voltage source converter of claim 1, wherein the semiconductor diode is a freewheeling diode.

6. The voltage source converter of claim 5, further comprising a phase-conversion subsystem having at least two of said diode cells and at least two of said power turn-off semiconductor cells, said subsystem being adapted for converting a phase of an alternating current supplied to the voltage source converter.

7. The voltage source converter of claim 1, wherein said voltage source converter is a multipoint voltage source converter for multiple phases.

8. The voltage source converter of claim 1, wherein said voltage source converter has at least one additional power turn-off semiconductor and said additional power turn-off semiconductor and said power turn-off semiconductor are connected in series.

9. The voltage source converter of claim 1 wherein said common drive circuit has a common voltage supply.

10. The voltage source converter of claim 9, wherein said common voltage supply is provided from an AC voltage source having a downstream transformer and downstream rectification.

11. The voltage source converter of claim 1, wherein said common drive circuit has a common drive signal transmission.

12. The voltage source converter of claim 11, wherein said common drive signal transmission is provided using at least one of the following signal transmission means: optocouplers, optical waveguides, pulse transformers.

13. The voltage source converter of claim 1, wherein said gate electrode is disposed in the vicinity of said pn junction.

14. The voltage source converter of claim 2, wherein said breakdown voltage in said first state and in said second state is at least 1000 V when said semiconductor diode is reverse-biased.

* * * * *